United States Patent
Lee et al.

(10) Patent No.: US 9,178,057 B2
(45) Date of Patent: *Nov. 3, 2015

(54) LATERAL DOUBLE DIFFUSED METAL-OXIDE-SEMICONDUCTOR DEVICE AND METHOD FOR FABRICATING THE SAME

(71) Applicant: VANGUARD INTERNATIONAL SEMICONDUCTOR CORPORATION, Hsinchu (TW)

(72) Inventors: Tsung-Hsiung Lee, Taoyuan (TW); Jui-Chun Chang, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 40 days.

This patent is subject to a terminal disclaimer.

(21) Appl. No.: 14/086,633

(22) Filed: Nov. 21, 2013

(65) Prior Publication Data

US 2015/0137231 A1    May 21, 2015

(51) Int. Cl.
| | |
|---|---|
| H01L 29/00 | (2006.01) |
| H01L 29/78 | (2006.01) |
| H01L 29/66 | (2006.01) |
| H01L 29/10 | (2006.01) |

(52) U.S. Cl.
CPC ........ *H01L 29/7816* (2013.01); *H01L 29/1095* (2013.01); *H01L 29/66681* (2013.01)

(58) Field of Classification Search
CPC .................. H01L 29/66613; H01L 29/66621; H01L 29/66681; H01L 29/0856; H01L 29/0869; H01L 29/7816; H01L 29/1095
See application file for complete search history.

(56) References Cited

U.S. PATENT DOCUMENTS

| | | | |
|---|---|---|---|
| 8,803,236 B1 * | 8/2014 | Lee et al. | 257/340 |
| 2007/0034944 A1 * | 2/2007 | Xu et al. | 257/335 |
| 2012/0273879 A1 * | 11/2012 | Mallikarjunaswamy et al. | 257/335 |

* cited by examiner

*Primary Examiner* — Su C Kim

(74) *Attorney, Agent, or Firm* — Birch, Stewart, Kolasch & Birch, LLP

(57) ABSTRACT

A lateral double diffused metal-oxide-semiconductor device includes: a semiconductor substrate; an epitaxial semiconductor layer disposed over the semiconductor substrate; a gate structure disposed over the epitaxial semiconductor layer; a first doped region disposed in the epitaxial semiconductor layer at a first side of the gate structure; a second doped region disposed in the epitaxial semiconductor layer at a second side of the gate structure; a third doped region disposed in the first doped region; a fourth doped region disposed in the second doped region; a trench formed in the third doped region, the first doped region and the epitaxial semiconductor layer under the first doped region; a conductive contact formed in the trench; and a fifth doped region disposed in the epitaxial semiconductor layer under the trench.

16 Claims, 6 Drawing Sheets

US 9,178,057 B2

LATERAL DOUBLE DIFFUSED METAL-OXIDE-SEMICONDUCTOR DEVICE AND METHOD FOR FABRICATING THE SAME

BACKGROUND OF THE INVENTION

1. Field of the Invention

The present invention relates to integrated circuit (IC) devices, and in particular to a lateral double diffused metal-oxide-semiconductor (LDMOS) device and a method for fabricating the same.

2. Description of the Related Art

Recently, due to the rapid development of communication devices such as mobile communication devices and personal communication devices, wireless communication products such as mobile phones and base stations have been greatly developed. In wireless communication products, high-voltage elements of lateral double diffused metal-oxide-semiconductor (LDMOS) devices are often used as radio frequency (900 MHz-2.4 GHz) related elements therein.

LDMOS devices not only have a higher operating frequency, but they are also capable of sustaining a higher breakdown voltage, thereby having a high output power so that they can be used as power amplifiers in wireless communication products. In addition, due to the fact that LDMOS devices can be formed by conventional CMOS fabrications, LDMOS devices can be fabricated from a silicon substrate which is relatively cost-effective and employs mature fabrication techniques.

In FIG. 1, a schematic cross section showing a conventional N-type lateral double diffused metal-oxide-semiconductor (LDMOS) device applicable in a radio frequency (RF) circuit element is illustrated. As shown in FIG. 1, the N-type LDMOS device mainly comprises a P+ type semiconductor substrate 100, a P– type epitaxial semiconductor layer 102 formed over the P+ type semiconductor substrate 100, and a gate structure G formed over a portion of the P– type epitaxial semiconductor layer 102. A P– type doped region 104 is disposed in the P– type epitaxial semiconductor layer 102 under the gate structure G and a portion of the P– type epitaxial semiconductor layer 102 under the left side of the gate structure G, and an N– type drift region 106 is disposed in a portion of the P– type epitaxial semiconductor layer 102 under the right side of the gate structure G. A P+ type doped region 130 and an N+ type doped region 110 are disposed in a portion of the P type doped region 104, and the P+ doped region 130 partially contacts a portion of the N+ type doped region 110, thereby functioning as a contact region (e.g. P+ type doped region 130) and a source region (e.g. N+ type doped region 110) of the N type LDMOS device, respectively, and another N+ type doped region 108 is disposed in a portion of the P– type epitaxial semiconductor layer 102 at the right side of the N– type drift region 106 to function as a drain region of the N type LDMOS device. In addition, an insulating layer 112 is formed over the gate structure G, covering sidewalls and a top surface of the gate structure G and partially covering the N+ type doped regions 108 and 110 adjacent to the gate structure G. Moreover, the N type LDMOS further comprises a P+ type doped region substantially disposed in a portion of the P– type epitaxial semiconductor layer 102 under the N+ type doped region 110 and the P– type doped region 104 under the N+ type doped region 110. The P+ type doped region 120 physically connects the P– type doped region 104 with the P+ type semiconductor substrate 100.

During operation of the N type LDMOS device shown in FIG. 1, due to the formation of the P+ type doped region 120, currents (not shown) from the drain side (e.g. N+ type doped region 108) laterally flow through a channel (not shown) underlying the gate structure G towards a source side (e.g. N+ type doped region 110), and are then guided by the P– type doped region 104 and the P+ type doped region 120, thereby arriving at the P+ type semiconductor substrate 100, such that problems such as inductor coupling and cross-talk between adjacent circuit elements can be avoided. However, the formation of the P+ type doped region 120 requires the performance of ion implantations of high doping concentrations and high doping energies and thermal diffusion processes with a relatively high temperature above about 900° C., and a predetermined distance D1 is kept between the gate structure G and the N+ type doped region 110 at the left side of the gate structure G to ensure good performance of the N type LDMOS device. Therefore, formation of the P+ type doped region 120 and the predetermined distance D1 kept between the gate structure G and the N+ type doped region 110 increase the on-state resistance (Ron) of the N type LDMOS device and a dimension of the N type LDMOS device, which is unfavorable for further reduction of both the fabrication cost and the dimensions of the N type LDMOS device.

BRIEF SUMMARY OF THE INVENTION

Accordingly, an improved lateral double diffused metal oxide semiconductor (LDMOS) device and method for fabricating the same are provided to reduce size and fabrication cost.

An exemplary lateral double diffused metal oxide semiconductor (LDMOS) device comprises a semiconductor substrate, having a first conductivity type. An epitaxial semiconductor layer is formed over the semiconductor substrate, having the first conductivity type. A gate structure is disposed over a portion of the epitaxial semiconductor layer. A first doped region is disposed in a portion of the epitaxial semiconductor layer adjacent to a first side of the gate structure, having the first conductivity type. A second doped region is disposed in a portion of the epitaxial semiconductor layer adjacent to a second side of the gate structure opposing to the first side, having a second conductivity type opposite to the first conductivity type. A third doped region is disposed in a portion of the first doped region, having the second conductivity type. A fourth doped region is disposed in a portion of the second doped region, having the second conductivity type. A trench is formed in a portion of the third doped region, the first doped region, and the epitaxial semiconductor layer under the first doped region. A conductive contact is formed in the trench. A fifth doped region is disposed in a portion of the epitaxial semiconductor layer under the first doped region, having the first conductivity type, wherein the fifth doped region physically contacts the semiconductor substrate and surrounds portions of sidewalls and a bottom surface of the conductive contact.

An exemplary method for fabricating a lateral double diffused metal oxide semiconductor (LDMOS) device comprises providing a semiconductor substrate, having a first conductivity type. An epitaxial semiconductor layer is formed over the semiconductor substrate, having the first conductivity type. A gate structure is formed over a portion of the epitaxial semiconductor layer. A first doped region is formed in a portion of the epitaxial semiconductor layer adjacent to a first side of the gate structure, having the first conductivity type. A second doped region is formed in a portion of the epitaxial semiconductor layer adjacent to a second side of the gate structure opposite to the first side, having a second conductivity type opposite to the first conductivity type. A third doped region is formed in a portion of the first doped region, having the second conductivity type. A fourth doped region is formed in a portion of the second doped region, having the second conductivity type opposite to the first conductivity type. An insulating layer is formed over the second doped region, the gate structure, and a portion of the third doped region. A trench is formed in a portion of the third doped region, and the epitaxial semiconductor layer under the first doped region adjacent to the insulating layer. An ion implantation process is performed, implanting dopants of the first conductive type in the epitaxial semiconductor layer exposed by the trench, thereby forming a fifth doped region, wherein the fifth doping region physically contacts the semiconductor substrate. A conductive contact is formed in the trench, wherein the conductive contact physically contacts the fifth doped region.

An exemplary method for fabricating a lateral double diffused metal oxide semiconductor (LDMOS) device comprises providing a semiconductor substrate, having a first conductivity type. A first epitaxial semiconductor layer is formed over the semiconductor substrate, having the first conductivity type. A first trench is formed in a portion of the first epitaxial semiconductor layer. An ion implantation process is performed, implanting dopants of the first conductivity type in the first epitaxial semiconductor layer exposed by the first trench, thereby forming a first doped region, wherein the first doped region physically contacts the semiconductor substrate. A second epitaxial semiconductor layer is formed in the first trench. A gate structure is formed over a portion of the epitaxial semiconductor layer, adjacent to the second epitaxial semiconductor layer. A second doped region is formed in a portion of the first epitaxial semiconductor layer adjacent to a first side of the gate structure, surrounding the second epitaxial semiconductor layer, having the first conductivity type. A third doped region is formed in a portion of the first epitaxial semiconductor layer adjacent to a second side of the gate structure opposing to the first side, having a second conductivity type opposite to the first conductivity type. A fourth doped region is formed in a portion of the second doped region, having the second conductivity type. A fifth doped region is formed in a portion of the third doped region, having the second conductivity type. An insulating layer is formed over the fourth doped region, the gate structure, and a portion of the fifth doped region. The second epitaxial semiconductor layer is partially removed to form a second trench, wherein the second trench partially exposes a portion of the second and fourth doped regions. A conductive contact is formed in the second trench, wherein the conductive contact physically contacts the second epitaxial semiconductor layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-6 are schematic cross sections showing an exemplary method for fabricating a lateral double diffused metal-oxide-semiconductor (LDMOS) device applicable for a radio frequency (RF) circuit element.

Figure 2:
FIGS. 2-6 are schematic cross sections showing a method for fabricating a lateral double diffused metal-oxide-semiconductor (LDMOS) device according to an embodiment of the invention.

Referring to FIG. 2, a semiconductor substrate 200 such as a silicon substrate is first provided. In one embodiment, the semiconductor substrate 200 has a first conductivity type such as a P type, and a resistivity of about 0.001-0.005 ohms-cm ($\Omega$-cm). Next, an epitaxial semiconductor layer 202, for example an epitaxial silicon layer, is formed over the semiconductor substrate 200. The epitaxial semiconductor layer 202 can be in-situ doped with dopants of the first conductivity type such as P type during the formation thereof, and has a resistivity of about 0.5-1 ohms-cm ($\Omega$-cm). In one embodiment, the resistivity of the epitaxial semiconductor layer 202 is greater than that of the semiconductor substrate 200.

Figure 3:
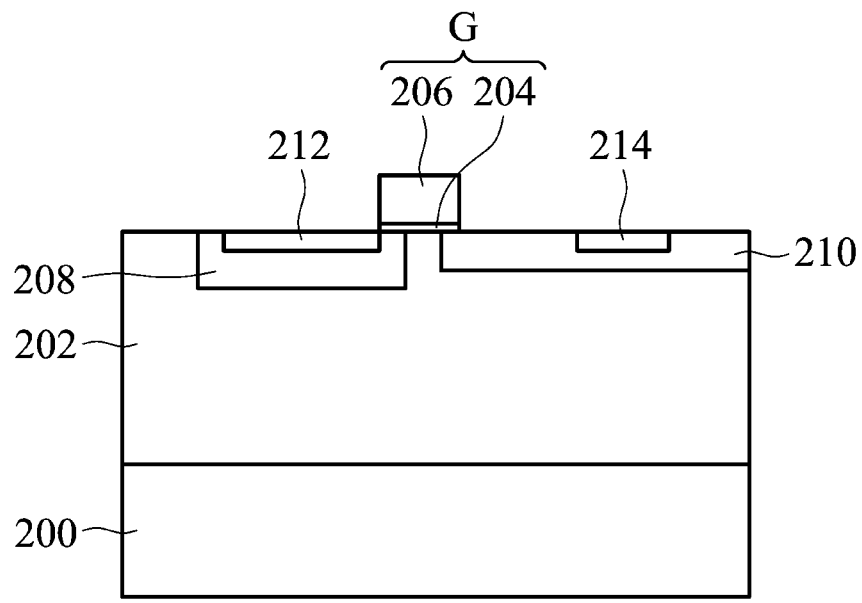

Referring to FIG. 3, a patterned gate structure G is formed over a portion of the epitaxial semiconductor layer 202, and the gate structure G mainly comprises a gate dielectric layer 204 and a gate electrode 206 sequentially formed over a portion of the epitaxial semiconductor layer 202. The gate dielectric layer 204 and the gate electrode 206 of the gate structure G can be formed by conventional gate processes and related gate materials, and are not described here in detail for the purpose of simplicity. Next, a plurality of suitable masks (not shown) and a plurality of ion implant processes (not shown) are then performed to form a doped region 208 in a portion of the epitaxial semiconductor layer 202 at the left side of the gate structure G, and a doped region 210 in a portion of the epitaxial semiconductor layer 202 at the right side of the gate structure G. In one embodiment, the doped region 208 has the first conductivity type such as P type and a dopant concentration of about $1*10^{13}$-$5*10^{14}$ atom/cm$^2$, and the doped region 210 has a second conductivity type such as N type opposite to the P type and a dopant concentration of about $5*10^{11}$-$5*10^{13}$ atom/cm$^2$, and the ion implant processes (not shown) for forming the doped regions 208 and 210 can be ion implant processes with tilted implantation angles.

Next, another suitable implant mask (not shown) and an ion implantation process (not shown) are performed to form a doped region 212 and a doped region 214 in a portion of the doped regions 208 and 210 on opposite sides of the gate structure G, respectively, and the configuration shown in FIG. 3 is formed after performing a thermal diffusion process (not shown). In one embodiment, the doped region 212 formed in a portion of the doped region 208 and the doped region 214 formed in a portion of the doped region 210 respectively have the second conductivity type such as N type and a dopant concentration of about $1*10^{15}$-$5*10^{15}$ atom/cm$^2$, and the ion implantion process (not shown) for forming the doped regions 212 and 214 can be an ion implantation vertical to a surface of the epitaxial semiconductor layer 202. In one embodiment, the doped region 210 may function as a drift region, and the doped regions 212 and 214 may function as source and drain regions.

Figure 4:
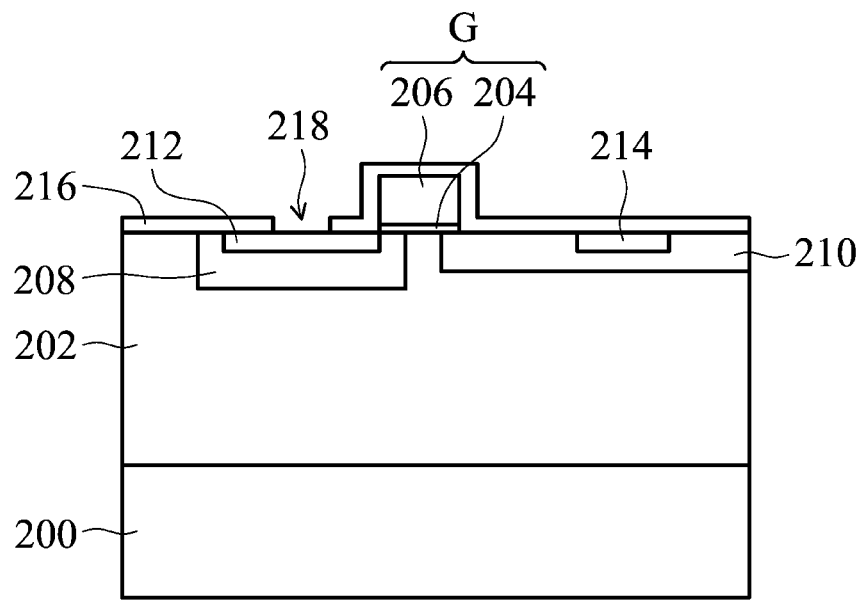

Referring to FIG. 4, an insulating layer 216 is next formed over the epitaxial semiconductor layer 202, and the insulating layer 216 conformably cover a plurality of sidewalls and a top surface of the gate structure G. Next, a patterning process (not shown) is performed to form an opening 218 in a portion of the insulating layer 216. As shown in FIG. 4, the opening 218 exposes a portion of the doped region 212 such that other portions of the epitaxial semiconductor layer 202 and surfaces of the gate structure G are still covered by the insulating layer 216. In one embodiment, the insulating layer 216 may comprise insulating materials such as silicon oxide and silicon nitride, and can be formed by methods such as chemical vapor deposition.

Figure 5:
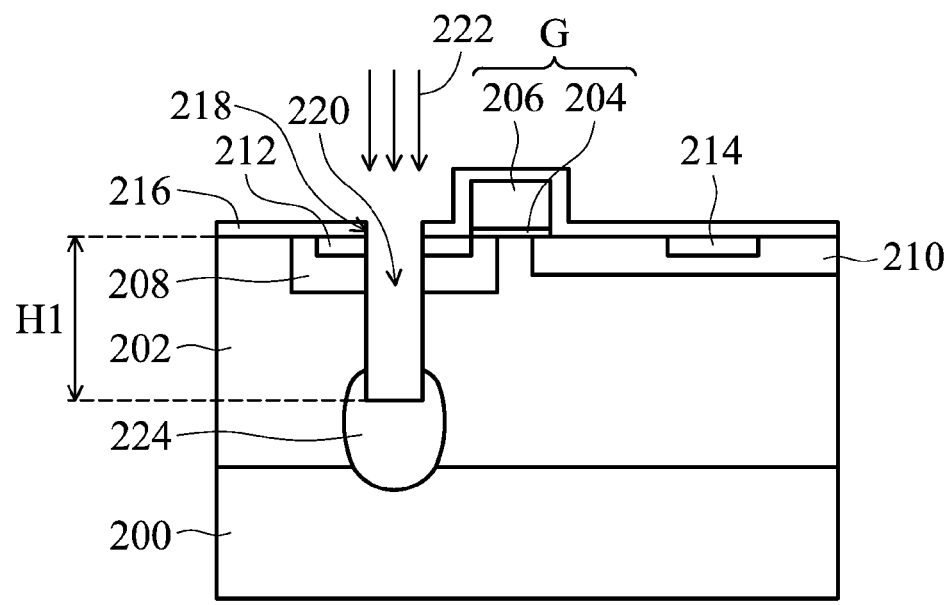

Referring to FIG. 5, an etching process (not shown) is performed next, using the insulating layer 216 as an etching mask, thereby forming a trench 220 in the epitaxial semiconductor layer 202 exposed by the opening 218. As shown in FIG. 5, the trench 220 is formed with a depth H1 which mainly penetrates the doped region 212, the doped region 208 and the epitaxial semiconductor layer 202. Next, an ion implantation process 222 is performed, using the insulating layer 216 as an implantation mask, to implant dopants of the first conductivity type such as P-type to a portion of the epitaxial semiconductor layer 202 exposed by the trench 220, and then a thermal diffusion process (not shown) is performed, thereby forming a doped region 224 in a portion of the epitaxial semiconductor layer 202 and the semiconductor substrate 200 as shown in FIG. 5. In one embodiment, the doped region 224 may have the first conductivity type such as P-type and has a dopant concentration of about $1*10^{15}$-$5*10^{15}$ atom/cm$^2$. In one embodiment, the dopant concentration in the doped region 224 may be greater than that in the epitaxial semiconductor layer 202.

Figure 6:
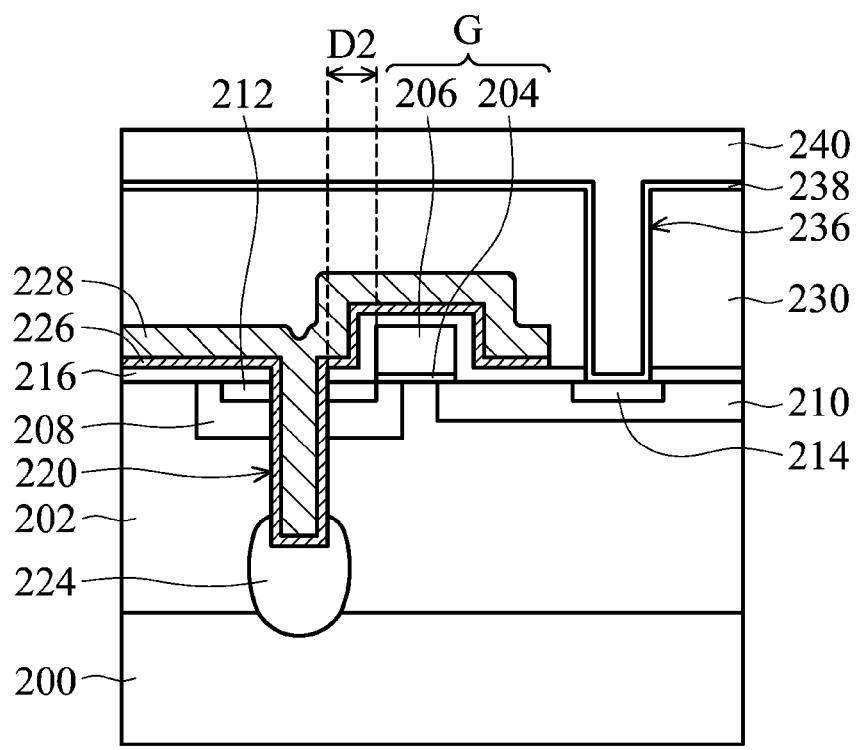

Referring to FIG. 6, a conductive layer 226 and another conductive layer 228 are then sequentially deposited, wherein the conductive layer 226 is conformably formed over surfaces of the insulating layer 216 and the bottom surface and the sidewalls of the epitaxial semiconductor layer 202 exposed by the trench 220, and the conductive layer 228 is formed over the surfaces of the conductive layer 228, thereby filling the trench 220. Next, a suitable implant mask (not shown) and a patterning process (not shown) are performed to pattern the conductive layers 226 and 228.

As shown in FIG. 6, the patterned conductive layers 226 and 228 are formed over the insulating layer 214 adjacent to the trench 220, extending over the bottom surface and the sidewalls of the trench 220, thereby covering surfaces of the epitaxial semiconductor layer 202, and the doped regions 208, 212 exposed by the trench 220, and the conductive layers 226 and 228 also cover the gate structure G and a portion of the doped region 210 adjacent to the gate structure G. However, the conductive layers 226 and 228 do not cover the doped region 214. The portion of the conductive layers 226 and 228 formed in the trench 220 may function as a conductive contact. At this time, the doped region 224 partially encircles the bottom surface and the sidewalls of the conductive layers 226 and 228 formed in the trench 220.

In one embodiment, the conductive layer 226 may comprise conductive materials such as Ti—TiN alloy, and the conductive layer 228 may comprise conductive materials such as tungsten. Next, a dielectric material such as silicon oxide or spin-on-glass (SOG) is deposited over the conductive layer 228, such that the dielectric material covers the conductive layer 228, the insulating layer 216, and the gate structure G, thereby forming an inter-layer dielectric (ILD) layer 230 with a substantially planar top surface. Next, a patterning process (not shown) comprising photolithography and etching steps is performed to form a trench 236 in a portion of the ILD layer 230 and the insulating layer 216 over a portion of the doped region 214, and the trench 236 exposes a portion of the doped region 214. Next, a conductive layer 238 and another conductive layer 240 are sequentially deposited, and the conductive layer 238 conformably forms over the surfaces of the ILD layer 234 and the sidewalls exposed by the trench 236, and the conductive layer 240 is formed over the surface of the conductive layer 238, thereby filling the trench 236. The portion of the conductive layers 238 and 240 formed in the trench 236 may function as a conductive contact. In one embodiment, the conductive layer 238 may comprise conductive materials such as Ti—TiN alloy, and the conductive layer 240 may comprise conductive materials such as tungsten. Therefore, an exemplary LDMOS device is substantially fabricated, as shown in FIG. 6.

In one embodiment, the gate structure G and the doped regions 212 and 214 of the LDMOS device shown in FIG. 6 may be properly electrically connected (not shown), and the regions with the first conductivity type can be P type regions, and the regions of the second conductivity type can be N type regions, such that the formed LDMOS device herein is an N type LDMOS device. At this time, the doped region 212 may function as a source region and the doped region 214 may function as a drain region.

In this embodiment, during operation of the LDMOS device shown in FIG. 6, currents from the drain side (e.g. the doped region 214) may laterally flow through a channel (not shown) under the gate stack G and toward the source side (e.g. doped region 212), and then arrive at the semiconductor substrate 200 by the guidance of the doped region 208, the conductive layers 226 and 228, and the doped region 224, such that undesired problems such as inductor coupling and cross-talk between adjacent circuit elements can be prevented.

Figure 1:
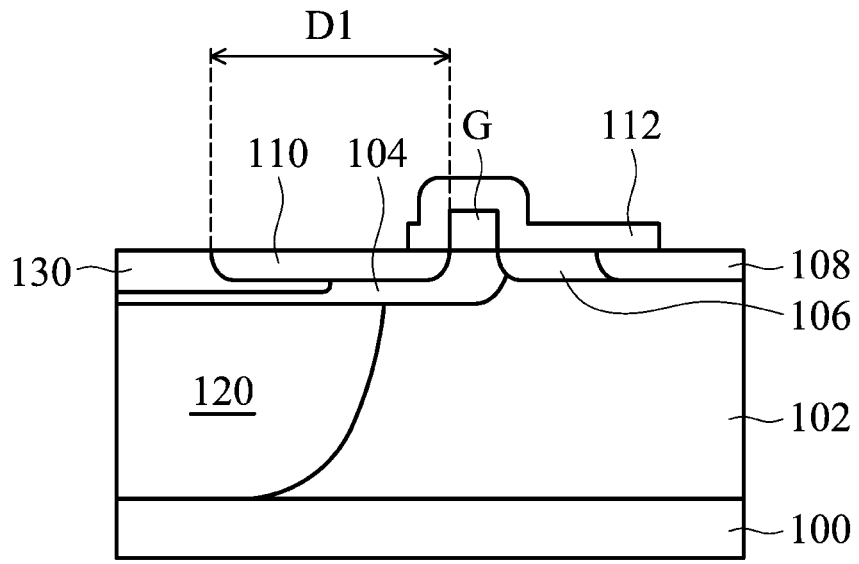
FIG. 1 is schematic cross section of a conventional lateral double diffused metal-oxide-semiconductor (LDMOS) device.

In this embodiment, due to the formation of the conductive layers 226 and 228 formed in the trench 220 and the doped region 224 embedded in the epitaxial semiconductor layer 202 and being in contact with the semiconductor substrate 200, such that ion implantation with high dosages and high energies for forming the P+ type doped region 120 as shown in FIG. 1 can be avoided, a predetermined distance D2 between the gate structure G and the doped region 212 at the right side of the trench 220 can be less than the predetermined distance D1 as shown in FIG. 1.

Therefore, when compared with the N type LDMOS device as shown in FIG. 1, the N type LDMOS device shown in FIG. 6 may have the advantages of reduced size and fabrication cost, and formation of the doped region 224 and the conductive layers 226 and 228 also helps to reduce the on-state resistance (Ron) of the N type LDMOS device.

In addition, in another embodiment, the regions with the first conductivity type of the LDMOS device shown in FIG. 6 can be N type regions, and the regions of the second conductivity type can be P type regions, such that the formed LDMOS device herein can be an P type LDMOS device.

FIGS. 7-11 are schematic cross sections showing another exemplary method for fabricating a lateral double diffused metal-oxide-semiconductor (LDMOS) device applicable for a radio frequency (RF) circuit element.

Figure 7:
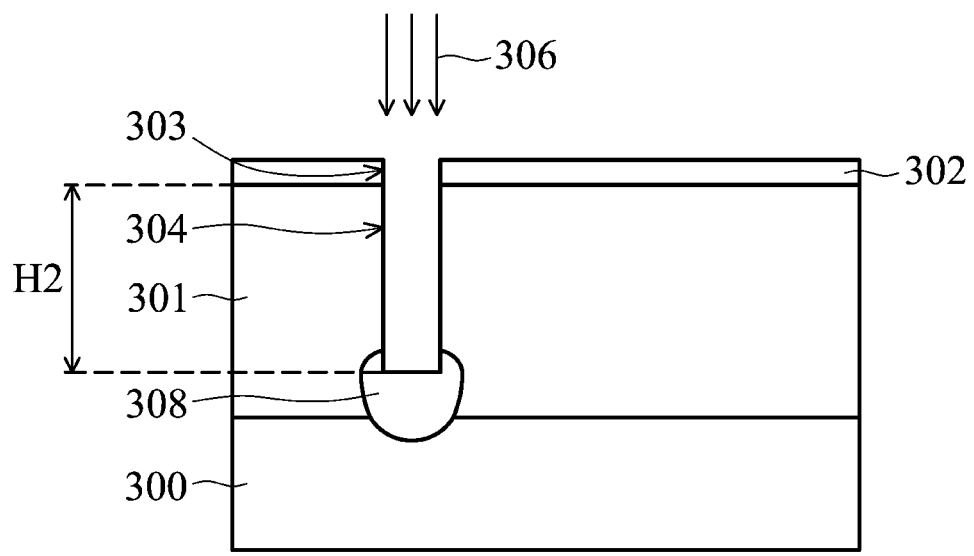
FIGS. 7-11 are schematic cross sections showing a method for fabricating a lateral double diffused metal-oxide-semiconductor (LDMOS) device according to an embodiment of the invention.

Referring to FIG. 7, a semiconductor substrate 300 such as a silicon substrate is first provided. In one embodiment, the semiconductor substrate 300 has a first conductivity type such as a P type, and a resistivity of about 0.001-0.005 ohms-cm (Ω-cm). Next, an epitaxial semiconductor layer 301, for example an epitaxial silicon layer, is formed over the semiconductor substrate 300. The epitaxial semiconductor layer 301 can be doped in-situ with dopants of the first conductivity type such as P type during the formation thereof, and has a resistivity of about 0.5-1 ohms-cm (Ω-cm). In one embodiment, the resistivity of the epitaxial semiconductor layer 301 is greater than that of the semiconductor substrate 300. Next, a patterned mask layer 302 is formed over the semiconductor substrate 300, and the patterned mask layer 302 comprises an opening 303 exposing a portion of the epitaxial semiconductor layer 301. The patterned mask layer 302 may comprise materials such as photoresists and the opening 303 can thus be formed by conventional photolithography and etching processes. Next, an etching process (not shown) is performed, using the patterned mask layer 302 as an etching mask, thereby forming a trench 304 in the epitaxial semiconductor layer 301 exposed by the opening 303.

As shown in FIG. 7, the trench 304 is formed with a depth 112. Next, an ion implantation process 306 is performed, using the patterned mask layer 302 as an implantation mask, to implant dopants of the first conductivity type such as P-type to a portion of the epitaxial semiconductor layer 301 exposed by the trench 304, and then a thermal diffusion process (not shown) is performed, thereby forming a doped region 308 in a portion of the epitaxial semiconductor layer 301 and the semiconductor substrate 300 as shown in FIG. 7. In one embodiment, the doped region 308 may have the first conductivity type such as P-type and a dopant concentration of about $1*10^{15}$-$5*10^{15}$ atom/cm$^2$. In one embodiment, the dopant concentration in the doped region 308 may be greater than that in the epitaxial semiconductor layer 301.

Figure 8:
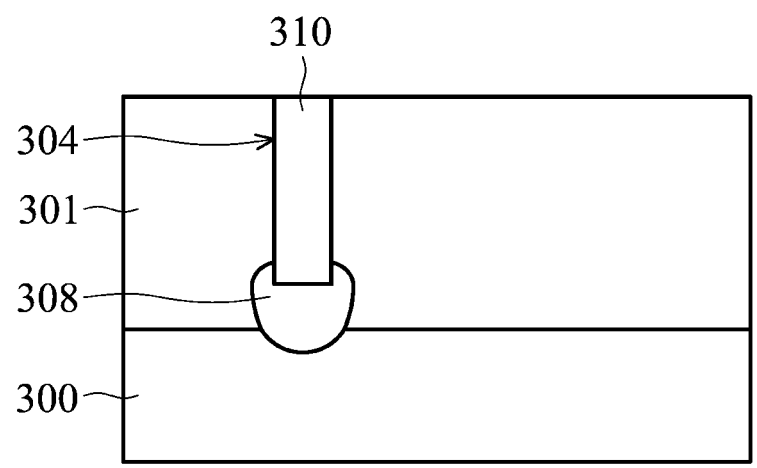

Referring to FIG. 8, after removal of the patterned mask layer 302, an epitaxial growth process (not shown) is next performed to grow epitaxial semiconductor materials over surfaces of the portions of the epitaxial semiconductor layer 301 exposed by the trench 304 and the top surface of the epitaxial semiconductor layer 301. The epitaxial semiconductor materials can be in-situ doped with dopants of the first conductivity type such as P type during the formation thereof. Next, a planarization process (not shown) is performed to remove the portion of the epitaxial materials over a top surface of the epitaxial semiconductor layer 301, thereby forming an epitaxial semiconductor layer 310 of doped epitaxial semiconductor materials in the trench 304 as a conductive layer. In one embodiment, the epitaxial semiconductor layer 310 has a resistivity of about 0.001 ohms-0.05 cm (Ω-cm).

Figure 9:
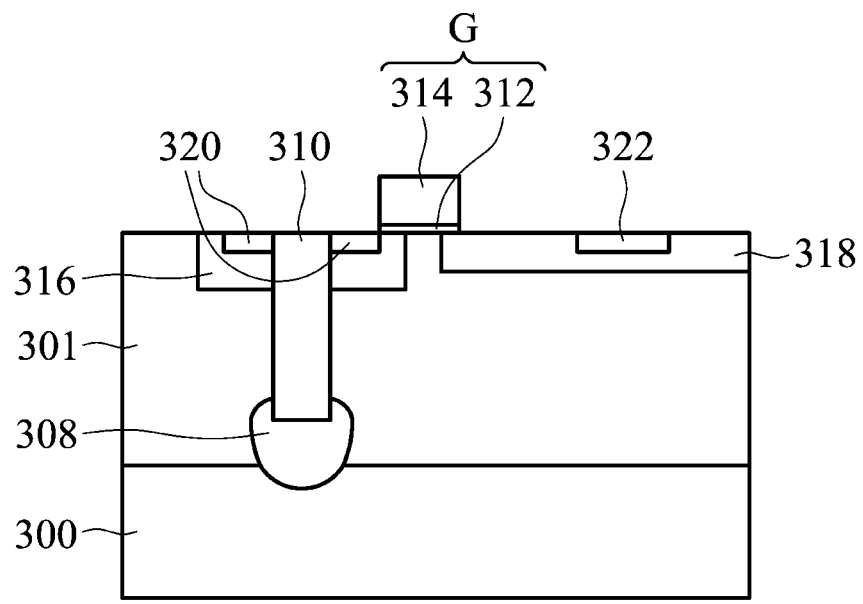

Referring to FIG. 9, a patterned gate structure G is formed over a portion of the epitaxial semiconductor layer 301, and the gate structure G mainly comprises a gate dielectric layer 312 and a gate electrode 314 sequentially formed over a portion of the epitaxial semiconductor layer 301. The gate dielectric layer 312 and the gate electrode 314 of the gate structure G can be formed by conventional gate processes and related gate materials, and are not described here in detail for the purpose of simplicity. Next, a plurality of suitable masks (not shown) and a plurality of ion implant processes (not shown) are then performed to form a doped region 316 in a portion of the epitaxial semiconductor layer 301 at the left side of the gate structure G, and a doped region 318 in a portion of the epitaxial semiconductor layer 301 at the right side of the gate structure G. In one embodiment, the doped region 316 has the first conductivity type such as P type and a dopant concentration of about $1*10^{13}$-$5*10^{14}$ atom/cm$^2$, and the doped region 318 has a second conductivity type such as N type opposite to the P type and a dopant concentration of about $5*10^{11}$-$5*10^{13}$ atom/cm$^2$, and the ion implant processes (not shown) for forming the doped regions 316 and 318 can be ion implant processes with tilted implantation angles.

Next, another suitable implant mask (not shown) and an ion implantation process (not shown) are performed to form a doped region 320 and a doped region 322 in a portion of the doped regions 316 and 318 on opposite sides of the gate structure G, respectively, and the configuration shown in FIG. 9 is formed after performing a thermal diffusion process (not shown). In one embodiment, the doped region 320 formed in a portion of the doped region 316 and the doped region 322 formed in a portion of the doped region 318 respectively has the second conductivity type such as N type and a dopant concentration of about $1*10^{15}$-$5*10^{15}$ atom/cm$^2$, and the ion implant process (not shown) for forming the doped regions 320 and 322 can be an ion implantation vertical to a surface of the epitaxial semiconductor layer 301. In one embodiment, the doped region 318 may function as a drift region, and the doped regions 320 and 322 may function as source and drain regions. As shown in FIG. 9, the doped regions 316 and 320 formed in the epitaxial semiconductor layer 301 at the left side of the gate structure surround a portion of the epitaxial semiconductor layer 310.

Figure 10:
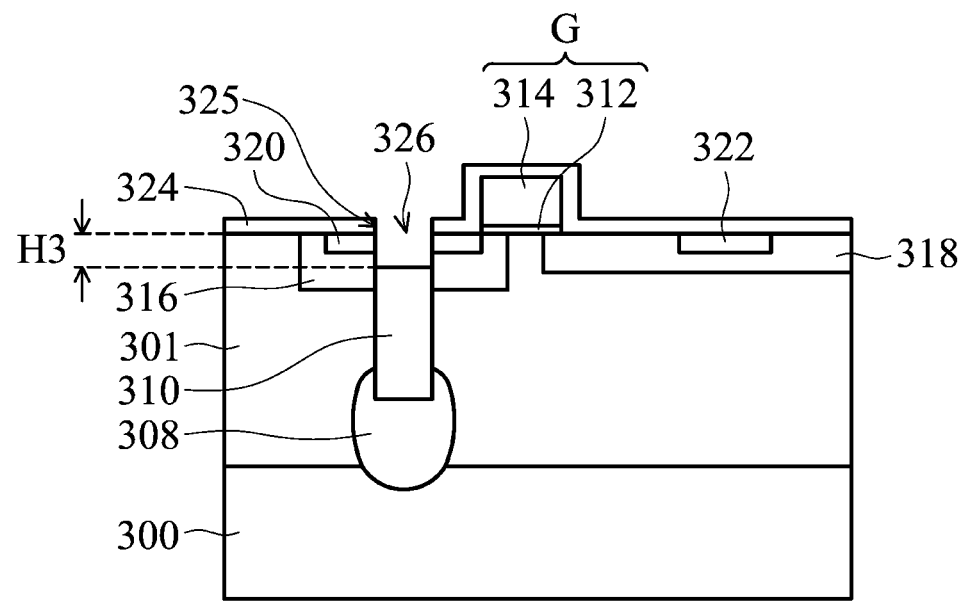

Referring to FIG. 10, an insulating layer 324 is next formed over the epitaxial semiconductor layer 301, and the insulating layer 324 conformably cover a plurality of sidewalls and a top surface of the gate structure G. Next, a patterning process (not shown) is performed to form an opening 325 in a portion of the insulating layer 324. As shown in FIG. 10, the opening 325 exposes a portion of the epitaxial semiconductor layer 310 surrounded by the doped region 320 such that other portions of the epitaxial semiconductor layer 301 and surfaces of the gate structure G are still covered by the insulating layer 324. In one embodiment, the insulating layer 216 may comprise insulating materials such as silicon oxide and silicon nitride, and can be formed by methods such as chemical vapor deposition. Next, an etching process (not shown) is performed, using the insulating layer 324 as an etching mask, thereby forming a trench 326 in the epitaxial semiconductor layer 310 exposed by the opening 325. As shown in FIG. 10, the trench 325 is formed with a depth H3, and the trench 326 mainly exposes portions of the doped region 320, the doped region 316 and the epitaxial semiconductor layer 310.

Figure 11:
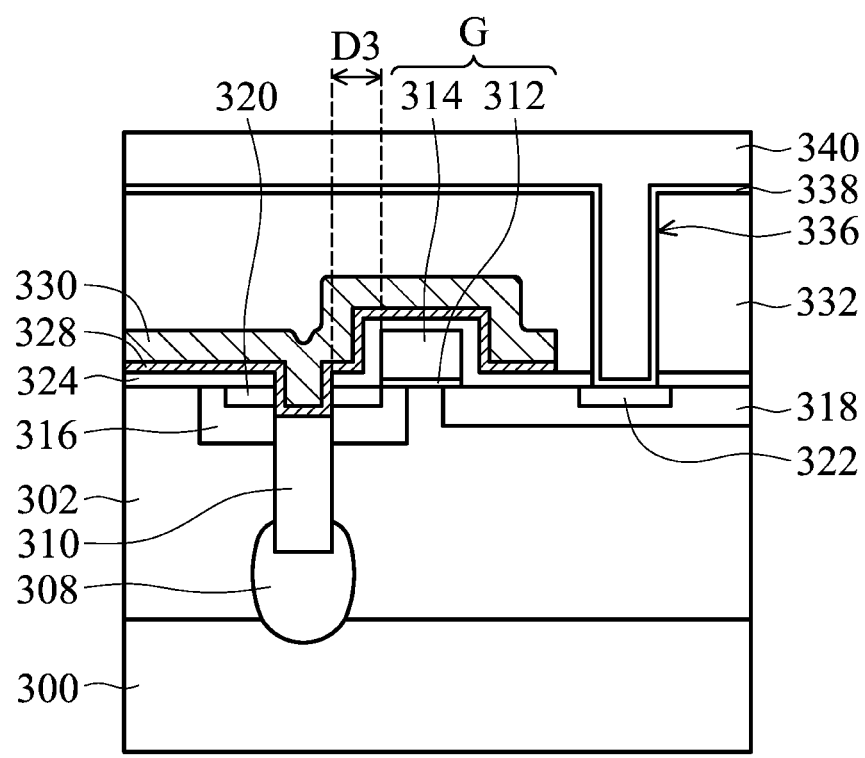

Referring to FIG. 11, a conductive layer 328 and another conductive layer 330 are then sequentially deposited, wherein the conductive layer 328 is conformably formed over surfaces of the insulating layer 324 and the bottom surface and the sidewalls of the doped regions 320, 316, and the epitaxial semiconductor layer 310 exposed by the trench 326, and the conductive layer 330 is formed over the surfaces of the conductive layer 328, thereby filling the trench 326. Next, a suitable implant mask (not shown) and a patterning process (not shown) are performed to pattern the conductive layers 328 and 330.

As shown in FIG. 11, the patterned conductive layers 328 and 330 are formed over the insulating layer 324 adjacent to the trench 326, extending over the bottom surface and the sidewalls of the trench 326, thereby covering surfaces of the epitaxial semiconductor layer 310, and the doped regions 316, 320 exposed by the trench 326, and the conductive layers 328 and 330 also cover the gate structure G and a portion of the doped region 318 adjacent to the gate structure G. However, the conductive layers 328 and 330 do not cover the doped region 322. The portion of the conductive layers 328 and 330 formed in the trench 326 and the epitaxial conductive layer 310 thereunder may function as a conductive contact.

In one embodiment, the conductive layer 328 may comprise conductive materials such as Ti—TiN alloy, and the conductive layer 330 may comprise conductive materials such as tungsten. Next, a dielectric material such as silicon oxide or spin-on-glass (SOG) is deposited over the conductive layer 330, such that the dielectric material covers the conductive layer 330, the insulating layer 324, and the gate structure G, thereby forming an inter-layer dielectric (ILD) layer 332 with a substantially planar top surface. Next, a patterning process (not shown) comprising photolithography and etching steps is performed to form a trench 336 in a portion of the ILD layer 332 and the insulating layer 324 over a portion of the doped region 322, and the trench 336 exposes a portion of the doped region 322. Next, a conductive layer 338 and another conductive layer 340 are sequentially deposited, and the conductive layer 338 conformably forms over the surfaces of the ILD layer 332 and the sidewalls exposed by the trench 336, and the conductive layer 340 is formed over the surface of the conductive layer 338, thereby filling the trench 336. The portion of the conductive layers 338 and 340 formed in the trench 336 may function as a conductive contact. In one embodiment, the conductive layer 338 may comprise conductive materials such as Ti—TiN alloy, and the conductive layer 340 may comprise conductive materials such as tungsten. Therefore, an exemplary LDMOS device is substantially fabricated, as shown in FIG. 11.

In one embodiment, the regions with the first conductivity type in the LDMOS device shown in FIG. 11 can be P type regions, and the regions of the second conductivity type can be N type regions, such that the formed LDMOS device herein is an N type LDMOS device. At this time, the doped region 320 may function as a source region and the doped region 322 may function as a drain region.

In this embodiment, during operation of the LDMOS device shown in FIG. 11, currents from the drain side (e.g. the doped region 322) may laterally flow through a channel (not shown) under the gate stack G and toward the source side (e.g. doped region 320), and then arrive at the semiconductor substrate 300 by the guidance of the doped regions 320 and 316, the epitaxial semiconductor layer 310, the conductive layers 328 and 330, and the doped region 308, such that undesired problems such as inductor coupling and cross-talk between adjacent circuit elements can be prevented.

In this embodiment, due to the formation of the conductive layers 328 and 330, the epitaxial layer 310 formed in the trench 326, and the doped region 308 embedded in the epitaxial semiconductor layer 301 and being in contact with the semiconductor substrate 300, such that ion implantation with high dosages and high energies for forming the P+ type doped region 120 as shown in FIG. 1 can be avoided, a predetermined distance D2 between the gate structure G and the doped region 212 at the right side of the trench 220 can be less than the predetermined distance D1 as shown in FIG. 1. Therefore, when compared with the N type LDMOS device as shown in FIG. 1, the N type LDMOS device shown in FIG. 11 may have the advantages of reduced size and fabrication cost, and formation of the doped region 308, the epitaxial semiconductor layer 310, and the conductive layers 328 and 330 also helps to reduce the on-state resistance (Ron) of the N type LDMOS device.

In addition, in another embodiment, the regions with the first conductivity type of the LDMOS device shown in FIG. 11 can be N type regions, and the regions of the second conductivity type can be P type regions, such that the formed LDMOS device herein can be a P type LDMOS device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lateral double diffused metal-oxide-semiconductor (LDMOS) device, comprising:
    a semiconductor substrate, having a first conductivity type;
    an epitaxial semiconductor layer formed over the semiconductor substrate, having the first conductivity type;
    a gate structure disposed over a portion of the epitaxial semiconductor layer;
    a first doped region disposed in a portion of the epitaxial semiconductor layer adjacent to a first side of the gate structure, having the first conductivity type;
    a second doped region disposed in a portion of the epitaxial semiconductor layer adjacent to a second side of the gate structure opposite to the first side, having a second conductivity type opposite to the first conductivity type;
    a third doped region disposed in a portion of the first doped region, having the second conductivity type;
    a fourth doped region disposed in a portion of the second doped region, having the second conductivity type;
    a trench formed in a portion of the third doped region, the first doped region, and the epitaxial semiconductor layer under the first doped region
    a conductive contact formed in the trench; and
    a fifth doped region disposed in a portion of the epitaxial semiconductor layer under the first doped region, having the first conductivity type, wherein the fifth doped region physically contacts the semiconductor substrate and surrounds portions of sidewalls and a bottom surface of the conductive contact, and the fifth doped region does not physically contact the first doped region.

2. The LDMOS device as claimed in claim 1, wherein the first conductivity type is P type and the second conductivity type is N type, or the first conductivity type is N type and the second conductivity type is P type.

3. The LDMOS device as claimed in claim 1, wherein the third doped region is a source region, and the fourth doped region is a drain region.

4. The LDMOS device as claimed in claim 1, wherein the fifth doped region has a dopant concentration greater than that of the epitaxial semiconductor layer.

5. The LDMOS device as claimed in claim 1, wherein the conductive contact comprises a first conductive layer, and a second conductive layer surrounded by the first conductive layer.

6. The LDMOS device as claimed in claim 1, wherein the conductive contact comprises an epitaxial semiconductor layer of the first conductivity type, and a first conductive layer and a second conductive layer formed over the epitaxial semiconductor layer, and the second conductive layer is surrounded by the first conductive layer.

7. A method for fabricating a lateral double diffused metal oxide semiconductor (LDMOS) device, comprising:
    providing a semiconductor substrate, having a first conductivity type;
    forming an epitaxial semiconductor layer over the semiconductor substrate, having the first conductivity type;
    forming a gate structure over a portion of the epitaxial semiconductor layer;
    forming a first doped region in a portion of the epitaxial semiconductor layer adjacent to a first side of the gate structure, having the first conductivity type;
    forming a second doped region in a portion of the epitaxial semiconductor layer adjacent to a second side of the gate structure opposite to the first side, having a second conductivity type opposite to the first conductivity type;

forming a third doped region in a portion of the first doped region, having the second conductivity type;

forming a fourth doped region in a portion of the second doped region, having the second conductivity type opposite to the first conductivity type;

forming an insulating layer over the second doped region, the gate structure, and a portion of the third doped region;

forming a trench in a portion of the third doped region, and the epitaxial semiconductor layer under the first doped region adjacent to the insulating layer;

performing an ion implantation process, implanting dopants of the first conductive type in the epitaxial semiconductor layer exposed by the trench, thereby forming a fifth doped region, wherein the fifth doping region physically contacts the semiconductor substrate and does not physically contact the first doped region; and forming a conductive contact in the trench, wherein the conductive contact physically contacts the fifth doped region.

8. The method as claimed in claim 7, wherein the first conductivity type is P type and the second conductivity type is N type, or the first conductivity type is N type and the second conductivity type is P type.

9. The method as claimed in claim 7, wherein the third doped region is a source region and the fourth doped region is a drain region.

10. The method as claimed in claim 7, wherein the fifth doped region exposed by the trench has a dopant concentration greater than that of the epitaxial semiconductor layer.

11. The method as claimed in claim 7, wherein the first conductive contact comprises a first conductive layer and a second conductive layer surrounded by the first conductive layer.

12. A method for fabricating a lateral double diffused metal oxide semiconductor (LDMOS) device, comprising:

providing a semiconductor substrate, having a first conductivity type;

forming a first epitaxial semiconductor layer over the semiconductor substrate, having the first conductivity type;

forming a first trench in a portion of the first epitaxial semiconductor layer;

performing an ion implantation process, implanting dopants of the first conductive type in the first epitaxial semiconductor layer exposed by the first trench, thereby forming a first doped region, wherein the first doped region physically contacts the semiconductor substrate;

forming a second epitaxial semiconductor layer in the first trench;

forming a gate structure over a portion of the epitaxial semiconductor layer, adjacent to the second epitaxial semiconductor layer;

forming a second doped region in a portion of the first epitaxial semiconductor layer adjacent to a first side of the gate structure, surrounding the second epitaxial semiconductor layer, having the first conductivity type, wherein the second doped region does not physically contact the first doped region;

forming a third doped region in a portion of the first epitaxial semiconductor layer adjacent to a second side of the gate structure opposing to the first side, having a second conductivity type opposite to the first conductivity type;

forming a fourth doped region in a portion of the second doped region, having the second conductivity type;

forming a fifth doped region in a portion of the third doped region, having the second conductivity type;

forming an insulating layer over the fourth doped region, the gate structure, and a portion of the fifth doped region;

partially removing the second epitaxial semiconductor layer and forming a second trench, wherein the second trench partially exposes a portion of the second and fourth doped regions; and forming a conductive contact in the second trench, wherein the conductive contact physically contacts the second epitaxial semiconductor layer.

13. The method as claimed in claim 12, wherein the first conductivity type is P type and the second conductivity type is N type, or the first conductivity type is N type and the second conductivity type is P type.

14. The method as claimed in claim 12, wherein the fourth doped region is a source region and the fifth doped region is a drain region.

15. The method as claimed in claim 12, wherein the first doped region exposed by the first trench has a dopant concentration greater than that of the first epitaxial semiconductor layer.

16. The method as claimed in claim 12, wherein the conductive contact comprises a first conductive layer and a second conductive layer surrounded by the first conductive layer.

* * * * *